United States Patent
Huang et al.

(10) Patent No.: US 10,050,173 B2
(45) Date of Patent: Aug. 14, 2018

(54) LIGHT EMITTING DEVICE COMPRISING MICRO-STRUCTURES

(71) Applicant: Genesis Photonics Inc., Tainan (TW)

(72) Inventors: Jing-En Huang, Tainan (TW); Kai-Shun Kang, Tainan (TW); Yu-Chen Kuo, Tainan (TW); Fei-Lung Lu, Tainan (TW); Teng-Hsien Lai, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 15/045,273

(22) Filed: Feb. 17, 2016

(65) Prior Publication Data

US 2016/0247985 A1 Aug. 25, 2016

Related U.S. Application Data

(60) Provisional application No. 62/116,923, filed on Feb. 17, 2015, provisional application No. 62/151,376, filed on Apr. 22, 2015.

(51) Int. Cl.
*H01L 33/22* (2010.01)
*B28D 5/00* (2006.01)
(Continued)

(52) U.S. Cl.
CPC .......... *H01L 33/0095* (2013.01); *H01L 33/22* (2013.01); *B28D 5/0011* (2013.01); *H01L 33/20* (2013.01)

(58) Field of Classification Search
CPC . H01L 29/04; H01L 29/045; H01L 21/02027; B28D 5/0005; B28D 5/0011
See application file for complete search history.

(56) References Cited

U.S. PATENT DOCUMENTS 8,872,202 B2 10/2014 Huang et al.
2003/0047745 A1 3/2003 Suzuki et al.
(Continued)

FOREIGN PATENT DOCUMENTS

CN 101467269 6/2009
CN 102593301 7/2012
(Continued)

OTHER PUBLICATIONS

"Office Action of China Related Application No. 201210574681.3", dated Feb. 1, 2016, p. 1-p. 6.
(Continued)

*Primary Examiner* — Davienne Monbleau
*Assistant Examiner* — Leslie Pilar Cruz
(74) *Attorney, Agent, or Firm* — JCIPRNET

(57) ABSTRACT

A light emitting device includes a semiconductor light emitting unit and a light-transmitting substrate. The light-transmitting substrate includes an upper surface having two long sides and two short sides and a side surface, and the semiconductor light emitting unit is disposed on the upper surface. The side surface includes two first surfaces, two second surfaces, and rough micro-structures. Each of the first surfaces is connected to one of the long sides of the upper surface, and each of the second surfaces is connected to one of the short sides of the upper surface. The rough micro-structures are formed on the first surfaces and the second surfaces, a covering rate of the rough micro-structures on each of the first surfaces is greater than or equal to a covering rate of the rough micro-structures on each of the second surfaces. A manufacturing method of the light emitting device is also provided.

26 Claims, 6 Drawing Sheets

(51) Int. Cl.
*H01L 33/00* (2010.01)
*H01L 33/20* (2010.01)

(56) References Cited

U.S. PATENT DOCUMENTS

| | | |
|---|---|---|
| 2004/0026700 A1 | 2/2004 | Akaike et al. |
| 2004/0109486 A1* | 6/2004 | Kinoshita ............ H01S 5/32341 372/45.01 |
| 2006/0145171 A1 | 7/2006 | Nitta et al. |
| 2007/0298529 A1 | 12/2007 | Maeda et al. |
| 2011/0169043 A1* | 7/2011 | Kang ...................... H01L 33/16 257/99 |
| 2011/0312193 A1* | 12/2011 | Abe .................... H01L 33/0095 438/795 |
| 2012/0319149 A1 | 12/2012 | Su et al. |
| 2013/0105761 A1* | 5/2013 | Lim ...................... H01L 33/007 257/13 |

FOREIGN PATENT DOCUMENTS

| | | |
|---|---|---|
| TW | 201103166 | 1/2011 |
| TW | 201123536 | 7/2011 |
| TW | 201301557 | 1/2013 |
| TW | I524553 | 3/2016 |

OTHER PUBLICATIONS

"Office Action of Taiwan Related Application No. 101145826", dated Jan. 20, 2015, p. 1-p. 4.
"Office Action of Taiwan Related Application No. 104138453", dated Oct. 3, 2016, p. 1-p. 4.
"Notice of Allowance of Related U.S. Appl. No. 13/917,646", dated Aug. 20, 2014, p. 1-p. 9.
"Office Action of Related U.S. Appl. No. 13/917,646", dated Mar. 24, 2014, p. 1-p. 18.
"Office Action of Taiwan Related Application, application No. 106125953", issued on May 30, 2018, p1-p3.

\* cited by examiner

LIGHT EMITTING DEVICE COMPRISING MICRO-STRUCTURES

CROSS-REFERENCE TO RELATED APPLICATION

This application claims the priority benefits of U.S. provisional application Ser. No. 62/116,923, filed on Feb. 17, 2015 and U.S. provisional application Ser. No. 62/151,376, filed on Apr. 22, 2015. The entirety of each of the above-mentioned patent applications is hereby incorporated by reference herein and made a part of this specification.

BACKGROUND OF THE INVENTION

1. Field of the Invention

The invention relates to an optical device and a manufacturing method thereof, and specially relates to a light emitting device and a manufacturing method thereof.

2. Description of Related Art

Among conventional optical devices, light emitting semiconducting electronic devices, such as light emitting diode (LED), have already developed to be capable of emitting optical beam of various wavelength bands, such as visible light, infrared light, ultraviolet light, and white light. Meanwhile, as the luminosity of LED increases, LED has widely applied to various domains such as lighting, displaying and indicator lighting. Since LED has the benefits of high efficiency, long lifetime, and fast response speed, it has gradually replaced traditional light source in the aforementioned application domains.

During the development of LED, the light emission efficiency, the light emission angle, and the light pattern of LED have always been one of the major items of improvement. Conventional LED has a substrate configured to carry semiconductor layers. In order to improve the aforementioned optical effect, additional treatment is often applied to the substrate so as to allow the light beam, which is emitted from the semiconductor layers and enters the substrate, to emit from the substrate. However, the aforementioned treatment often easily causing damage to the semiconductor layers on the substrate. The additional treatment not only increases the production cost, but also decreases the overall production yield of LED.

SUMMARY OF THE INVENTION

An embodiment of the invention provides a light emitting device, which has excellent light emission efficiency.

An embodiment of the invention provides a method for manufacturing a light emitting device, which may effectively manufacture the light emitting device having high light emission efficiency.

The light emitting device of an embodiment of the invention includes a semiconductor light emitting unit and a light-transmitting substrate. The light-transmitting substrate includes an upper surface having two long sides and two short sides and a side surface. The semiconductor light emitting unit is disposed on the upper surface. The side surface includes two first surfaces, two second surfaces, and rough micro-structures. Each of the first surfaces is connected to one of the two long sides of the upper surface, and each of the second surfaces is connected to one of the two short sides of the upper surface. The rough micro-structures are formed on the first surfaces and the second surfaces, and a covering rate of the rough micro-structures on each of the first surfaces is greater than or equal to a covering rate of the rough micro-structures on each of the second surfaces.

The method for manufacturing a light emitting device in an embodiment of the invention includes providing a wafer, and the wafer has a flat edge; cutting the wafer along a first direction by a cutting light beam, where the first direction is substantially perpendicular or nearly perpendicular to the flat edge; cutting the wafer along a second direction by the cutting light beam so as to form a plurality of light emitting devices, where the second direction is substantially parallel or nearly parallel to the flat edge. The aforementioned light emitting device includes a semiconductor light emitting unit and a light-transmitting substrate. The light-transmitting substrate includes an upper surface and a side surface, and the semiconductor light emitting unit is disposed on the upper surface. The upper surface has two long sides and two short sides, where the long sides are parallel to the second direction, and the short sides are parallel to the second direction. The side surface includes two first surfaces, two second surfaces, and rough micro-structures. Each of the first surfaces is connected to one of the two long sides, and each of the second surfaces is connected to one of the two short sides. The rough micro-structures are formed on the first surface and the second surface through the cutting light beam, and a covering rate of the rough micro-structures on each of the first surfaces is greater than or equal to a covering rate of the rough micro-structures on each of the second surfaces.

In an embodiment of the invention, the aforementioned each of the first surfaces includes at least a first strip-shaped region, and each of the second surfaces includes at least a second strip-shaped region. The first strip-shaped region extends along a first direction, and the second strip-shaped region extends along a second direction. The first direction and the second direction are parallel to the upper surface, and the rough micro-structures are disposed on the first strip-shaped region and the second strip-shaped region.

In an embodiment of the invention, the first strip-shaped region of each of the aforementioned first surfaces has a first width at a direction perpendicular to the first direction. The second strip-shaped region of each of the second surfaces has a second width at a direction perpendicular to the second direction. The first width is greater than or equal to the second width, and an area of the first strip-shaped region of each of the first surfaces is greater than an area of the second strip-shaped region of each of the second surfaces.

In an embodiment of the invention, each of the aforementioned first surfaces includes a plurality of the first strip-shaped regions, and a quantity of the first strip-shaped regions on each of the first surfaces is greater than a quantity of the second strip-shaped regions on each of the second surfaces.

In an embodiment of the invention, the first strip-shaped regions on each of the aforementioned first surfaces have at least an interval region therebetween. A covering rate of the interval region on the first surface falls within a range of 0.4 to 0.8.

In an embodiment of the invention, at least one of the first strip-shaped regions of each of the aforementioned first surfaces is connected to one of the second strip-shaped regions of the second surface.

In an embodiment of the invention, the aforementioned light-transmitting substrate satisfies:

$$1 \leq \frac{R_1}{R_2} \leq 3.$$

$R_1$ is the covering rate of the rough micro-structures on each of the first surfaces. $R_2$ is the covering rate of the rough micro-structures on each of the second surfaces.

In an embodiment of the invention, the aforementioned light-transmitting substrate satisfies:

$$\frac{d_{1B}}{d} \geq \frac{1}{3}$$
and
$$\frac{d_{2B}}{d} \geq \frac{1}{3}.$$

$d_{1B}$ is a shortest distance at a perpendicular direction between the rough micro-structures on each of the first surfaces and the upper surface. $d_{2B}$ is a shortest distance at the perpendicular direction between the rough micro-structures on each of the second surfaces and the upper surface. d is a thickness of the light-transmitting substrate at the perpendicular direction. The perpendicular direction is parallel to a normal vector of the upper surface.

In an embodiment of the invention, a ratio of a length of each of the aforementioned long sides to a length of each of the aforementioned short sides falls within a range of 1 to 20.

In an embodiment of the invention, in each of the aforementioned light emitting devices, the cutting light beam forms at least a first strip-shaped region on each of the first surfaces, and the cutting light beam forms at least a second strip-shaped region on each of the second surfaces.

In an embodiment of the invention, the aforementioned cutting light beam cuts the wafer along the first direction with a first width. The cutting light beam cuts the wafer along the second direction with a second width, and the first width is greater than or equal to the second width.

In an embodiment of the invention, a number of times the aforementioned cutting light beam cuts the wafer in the first direction is higher than a number of times of the cutting light beam cuts the wafer in the second direction.

In an embodiment of the invention, a minimum depth of the aforementioned cutting light beam at a position on the wafer being cut does not exceed ⅓ of a thickness of the light-transmitting substrate at a perpendicular direction. The perpendicular direction is parallel to a normal vector of the upper surface.

In an embodiment of the invention, the aforementioned light-transmitting substrate is formed by a crystalline material. The crystalline material includes a first crystal plane and a second crystal plane. The long side is perpendicular to a normal vector of the first crystal plane. The upper surface is parallel to the second crystal plane. An included angle formed by the normal vector of the first crystal plane and a normal vector of the second crystal plane is greater than 90°.

In an embodiment of the invention, the aforementioned crystalline material further includes a third crystal plane. A normal vector of the third crystal plane is perpendicular to the normal vector of the second crystal plane.

In an embodiment of the invention, the aforementioned first crystal plane is a (1012) crystal plane. The second crystal plane is a (0001) crystal plane.

In an embodiment of the invention, the aforementioned crystalline material is sapphire.

Based on the above, the substrate of the light emitting device of the embodiment t of the invention has the rough micro-structures. The covering rate of the rough micro-structures on the first surface is greater than or equal to the covering rate of the rough micro-structures on the second surface. Thus, the light emitting device may have excellent light emission efficiency. The method for manufacturing the light emitting device of the embodiments of the invention may form the rough micro-structures at a suitable position while cutting the light emitting device, and overall, the area cut by the cutting light beam at the first direction on the wafer is greater than the area cut by the cutting light beam at the second direction on the wafer. Thus, the light emitting device with excellent light emission efficiency may be formed.

To make the aforementioned features and advantages of the invention more comprehensible, several embodiments accompanied with drawings are described in detail as follows.

DESCRIPTION OF THE EMBODIMENTS

Figure 1:
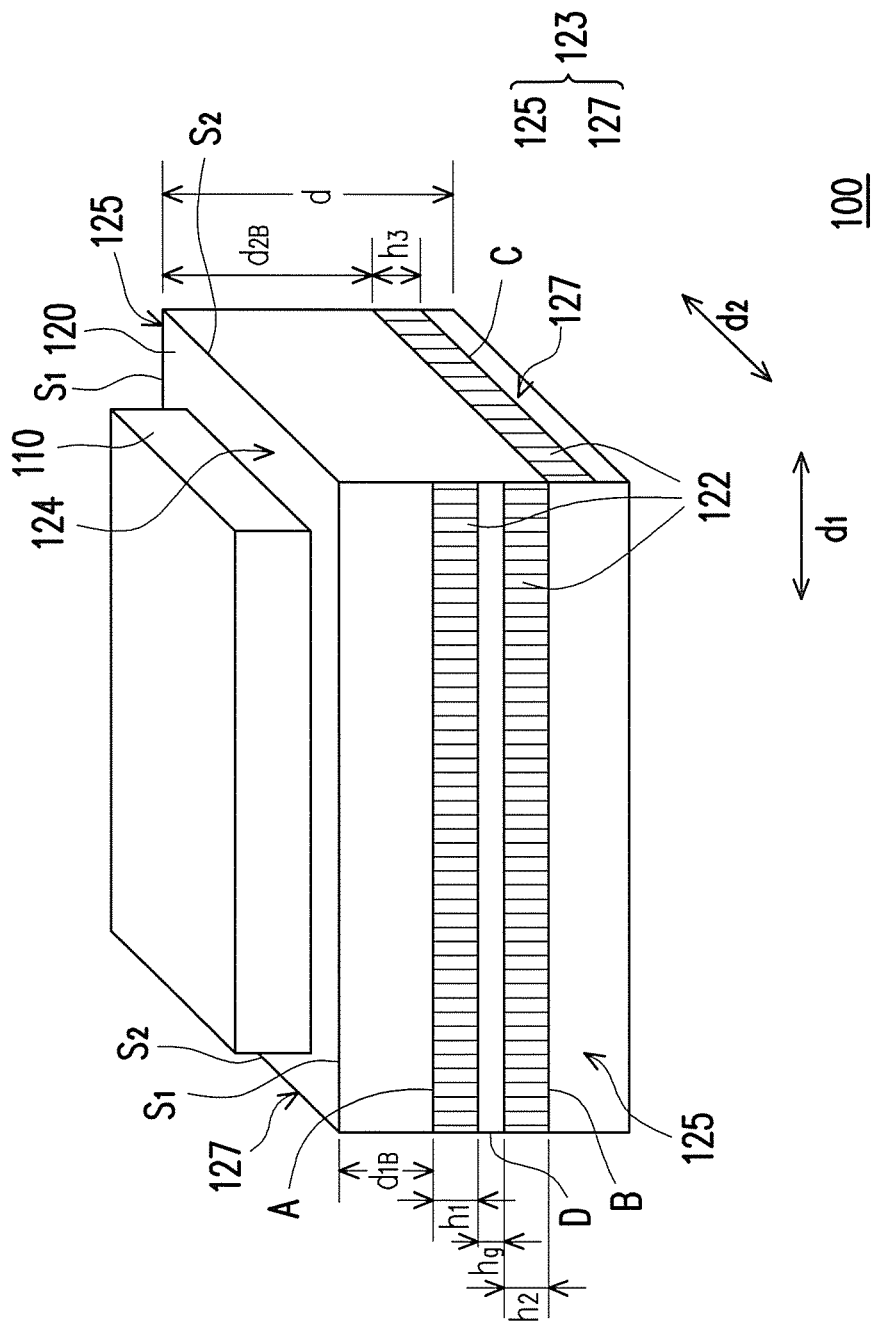
FIG. 1 is a schematic view of a light emitting device according to the first embodiment of the invention.

FIG. 1 is a schematic view of a light emitting device according to the first embodiment of the invention. The light emitting device provided by the present embodiment is suitable for emitting light beam. Referring to FIG. 1, in the first embodiment of the invention, a light emitting device 100 includes a semiconductor light emitting unit 110 and a light-transmitting substrate 120. The light-transmitting substrate 120 includes a side surface 123 and an upper surface 124 which has two long sides $S_1$ and two short sides $S_2$, and the semiconductor light emitting unit 110 is disposed on the upper surface 124. In other words, the shape of the upper surface 124 of the light-transmitting substrate 120 in the present embodiment is, for example, a parallelogram or a rectangle, which may have a pair of relatively longer sides $S_1$ that are parallel to each other and a pair of relatively shorter sides $S_2$ that are parallel to each other. The sides $S_1$, $S_2$ and the side surface 123 are connected to each other, but the invention is not limited to the aforementioned shapes and sizes.

Referring to FIG. 1, the side surface 123 of the first embodiment of the invention includes two first surfaces 125, two second surfaces 127, and rough micro-structures 122. The two first surfaces 125 are respectively connected to two long sides S₁ of the upper surface 124, and the two second surfaces 127 are respectively connected to two short sides S₂ of the upper surface 124. In other words, in the present embodiment, the side surface 123 surrounding the light-transmitting substrate 120 is connected to the long sides S₁ and the short sides S₂ of the upper surface 124 through planes with different sizes, and an area of the first surface 125 connected to the long sides S₁ is greater than an area of the second surface 127 connecting to the short sides S₂.

In the present embodiment, the rough micro-structures 122 are formed on the first surface 125 and the second surface 127, and a covering rate of the rough micro-structures 122 on each of the first surfaces 125 is greater than or equal to a covering rate of the rough micro-structures 122 on each of the second surfaces 127. In detail, the rough micro-structures 122 are formed on part of the side surface 123, and two first surfaces 125 and two second surfaces 127 respectively have the rough micro-structures 122 formed thereon. A percentage of a covering area of the rough micro-structures 122 on the first surface 125 in a total area of the first surface 125 is greater than a percentage of a covering area of the rough micro-structures 122 on the second surface 127 in a total area of the second surface 127, and the covering area of the rough micro-structures 122 on the first surface 125 is greater than the covering area of the rough micro-structures 122 on the second surface 127.

Therefore, since in the light emitting device 100 of the present embodiment, the side surface 123 surrounding the light-transmitting substrate 120 has the rough micro-structures 122, when the semiconductor light emitting unit 110 emits light beam to the light-transmitting substrate 120, the rough micro-structures 122 surrounding the light-transmitting substrate 120 may allow the aforementioned light beam to efficiently emit from the light-transmitting substrate 120. On the other hand, the rough micro-structures 122 in the present embodiment has a greater covering rate and covering area on the first surface 125 having a larger area. Therefore, the light in the light-transmitting substrate 120 and transmitted to the first surface 125 may emit from the first surface 125 easier, so as to further improve the overall light-emitting pattern and emission angle of the light emitting device 100.

Specifically, in the present embodiment, the rough micro-structures 122 are disposed on strip-shaped regions A, B and C on the side surface 123. In detail, the first surface 125 in the present embodiment includes the first strip-shaped regions A and B and the second surface 127 includes the second strip-shaped region C. The first strip-shaped regions A and B extend along a first direction d₁, and the second strip-shaped region C extends along a second direction d₂. The first direction d₁ and the second direction d₂ are parallel to the upper surface 124, and the rough micro-structures 122 are disposed on the first strip-shaped regions A and B and the second strip-shaped region C. In other words, the rough micro-structures 122 are respectively disposed on the first surface 125 and the second surface 127 along the direction d₁ and the direction d₂ perpendicular to a normal vector of the upper surface 124. The rough micro-structures 122 on the first strip-shaped regions A and B and the second strip-shaped region C surrounding the light-transmitting substrate 120 may consistently improve light emission efficiency on each angle of the light emitting device 100, thereby increasing emission angle of the light emitting device 100.

More specifically, in the present embodiment, a ratio of the covering rate of the rough micro-structures 122 of the light-transmitting substrate 120 on the first surface 125 to the second surface 127 satisfies:

$$1 \le \frac{R_1}{R_2} \le 3.$$

R₁ is the covering rate of the rough micro-structures 122 on each of the first surfaces 125. R₂ is the covering rate of the rough micro-structures 122 on each of the second surfaces 127. Therefore, the light emitting device 100 in the present embodiment has excellent light emission efficiency in each direction.

On the other hand, in the present embodiment, each of the first surfaces 125 includes two first strip-shaped regions A and B, and a quantity of the first strip-shaped regions A and B on each of the first surfaces 125 is greater than a quantity of the second strip-shaped region C on each of the second surfaces 127. In other words, in the present embodiment, by forming a plurality of the first strip-shaped regions A and B on the first surface 125 to increases the covering rate of the rough micro-structures 122 on the first surface 125, the covering rate of the rough micro-structures 122 on the first surface 125 is allowed to be greater than the covering rate of the rough micro-structures 122 on the second surface 127, and the covering area of the rough micro-structures 122 on the first surface 125 is greater than the covering area of the rough micro-structures 122 on the second surface 127.

Since the first strip-shaped regions A and B are extending along the first direction d₁ which is parallel to the long side S₁, and the second strip-shaped region C is extending along the second direction d₂ which is parallel to the short side S₂, a total width of the first strip-shaped regions A and B disposed with the rough micro-structures 122 on the first surface 125 may define the covering rate of the rough micro-structures 122 on the first surface 125, and a total width of the second strip-shaped region C disposed with the rough micro-structures 122 on the second surface 127 may define the covering rate of the rough micro-structures 122 on the second surface 127. Therefore, the light-transmitting substrate 120 of the present embodiment may satisfy (h₁+h₂)≥h₃, wherein h₁ is a width of the first strip-shaped region A at a direction perpendicular to the first direction d₁, h₂ is a width of the first strip-shaped region B at a direction perpendicular to the first direction d₁, and h₃ is a width of the second strip-shaped region C at a direction perpendicular to the second direction d₂.

On the other hand, in the present embodiment, the first strip-shaped region A and the first strip-shaped region B on the first surface 125 have an interval region D therebetween, and a covering rate of the interval region D on the first surface 125 falls within a range of 0.4 to 0.8. In a preferred embodiment of the invention, the covering rate of the interval region D on the first surface falls within a range of 0.5 to 0.7. More specifically, in the first embodiment of the invention, at the direction perpendicular to the first direction d₁, a width h_g of the interval region D falls within a range smaller than or equal to 200 micrometer. Therefore, the light-transmitting substrate 120 of the light emitting device 100 may adequately allocate the position of the rough micro-structures 122 on the side surface 123 via the first strip-shaped region A, the first strip-shaped region B, and the interval region D on the first surface 125, so as to improve the overall light emission efficiency of the light emitting device 100.

In the present embodiment, the light-transmitting substrate 120 satisfies:

$$\frac{d_{1B}}{d} \geq \frac{1}{3}$$

and $$\frac{d_{2B}}{d} \geq \frac{1}{3},$$

where $d_{1B}$ is a shortest distance at a perpendicular direction between the rough micro-structures 122 on each of the first surfaces 125 and the upper surface 124, $d_{2B}$ is a shortest distance at the perpendicular direction between the rough micro-structures 122 on each of the second surfaces 127 and the upper surface 124, d is a thickness of the light-transmitting substrate 120 at the perpendicular direction, and the perpendicular direction is parallel to a normal vector of the upper surface 124. Therefore, in the present embodiment, the rough micro-structures 122 on the light-transmitting substrate 120 and the upper surface 124 adapted for disposing the semiconductor light emitting unit 110 are kept with a suitable interval distance, so as to prevent the damage to the upper surface 124 and the semiconductor light emitting unit 110 caused by the formation of the rough micro-structures 122. In other words, in the present embodiment, since the side surface 123 of the light-transmitting substrate 120 has the rough micro-structures 122, the side surface 123 of the light-transmitting substrate 120 has excellent light extraction efficiency. Meanwhile, the interval between the rough micro-structures 122 and the upper surface 124 may prevent the loss of light emitting function of the light emitting device 100 due to the formation of the rough micro-structures 122.

On the other hand, in the present embodiment, the light-transmitting substrate 120 is formed by a crystalline material, and the crystalline material includes a first crystal plane and a second crystal plane. The long side $S_1$ of the upper surface 124 is perpendicular to a normal vector of the first crystal plane, the upper surface 124 is parallel to the second crystal plane, and an included angle formed by the normal vector of the first crystal plane and the second crystal plane is greater than 90°. In other words, in the present embodiment, the upper surface 124 of the light-transmitting substrate 120 is substantially formed primarily by the second crystal plane of the crystalline material, thereby allowing the growth of the semiconductor light emitting unit 110 thereon. The included angle between the first crystal plane and the second crystal plane is an obtuse angle. Therefore, when the first surface 125 connected to the long side $S_1$ is substantially formed primarily by the first crystal plane of the crystalline material, at least part of the first surface 125 and the horizontal upper surface 124 may form an obtuse angle, so as to allow the first surface 125 to have a better light extraction effect.

Specifically, in the present embodiment, the crystalline material is, for example, sapphire, but the invention is not limited thereto. In other embodiments, the crystalline material may further be other light-transmitting material suitable for growing or disposing on semiconductor. The aforementioned light-transmitting material includes two crystal planes and an included angle of normal vectors of the two crystal planes is an obtuse angle.

Miller index is used to further describe technical features of the light emitting device in the embodiments of the invention as follows. The material of the light-transmitting substrate 120 in the present embodiment is, for example, sapphire, and the first crystal plane is, for example, a (1012) crystal plane of the sapphire, namely, the R-plane of the sapphire. The second crystal plane is, for example, a (0001) crystal plane of the sapphire, namely, the c-plane of the sapphire. Therefore, when the first surface 125 of the light emitting device 100 forms substantially along the R-plane (1012), the first surface 125 may enhance the overall emission angle of the light emitting device 100.

Furthermore, in the embodiments of the invention, the crystalline material also includes a third crystal plane, and a normal vector of the third crystal plane is perpendicular to the normal vector of the second crystal plane. Therefore, in the present embodiment, the second direction $d_2$ is, for example, perpendicular to the normal vector of the third crystal plane. The normal vector of the third crystal plane is also perpendicular to the normal vector of the first crystal plane. Therefore, the first direction $d_1$ is perpendicular to the second direction $d_2$, but the invention is not limited thereto. In other embodiments, the second direction may further be altered according to directions of crystal planes of other crystalline materials, so as to obtain the best cutting effect.

Specifically, in the aforementioned embodiment, the third crystal plane is, for example, a (1120) crystal plane of the sapphire, namely, the a-plane of the sapphire, but the invention is not limited thereto.

Other embodiments are listed below for explanation. The following embodiments follow the reference numeral and partial contents of the aforementioned embodiments, the same reference numerals are adopted to represent identical or similar element, and the descriptions of same technical contents are omitted. Regarding descriptions of omitted parts, the aforementioned embodiments may be referenced, and no further description s provided herein.

Figure 2:
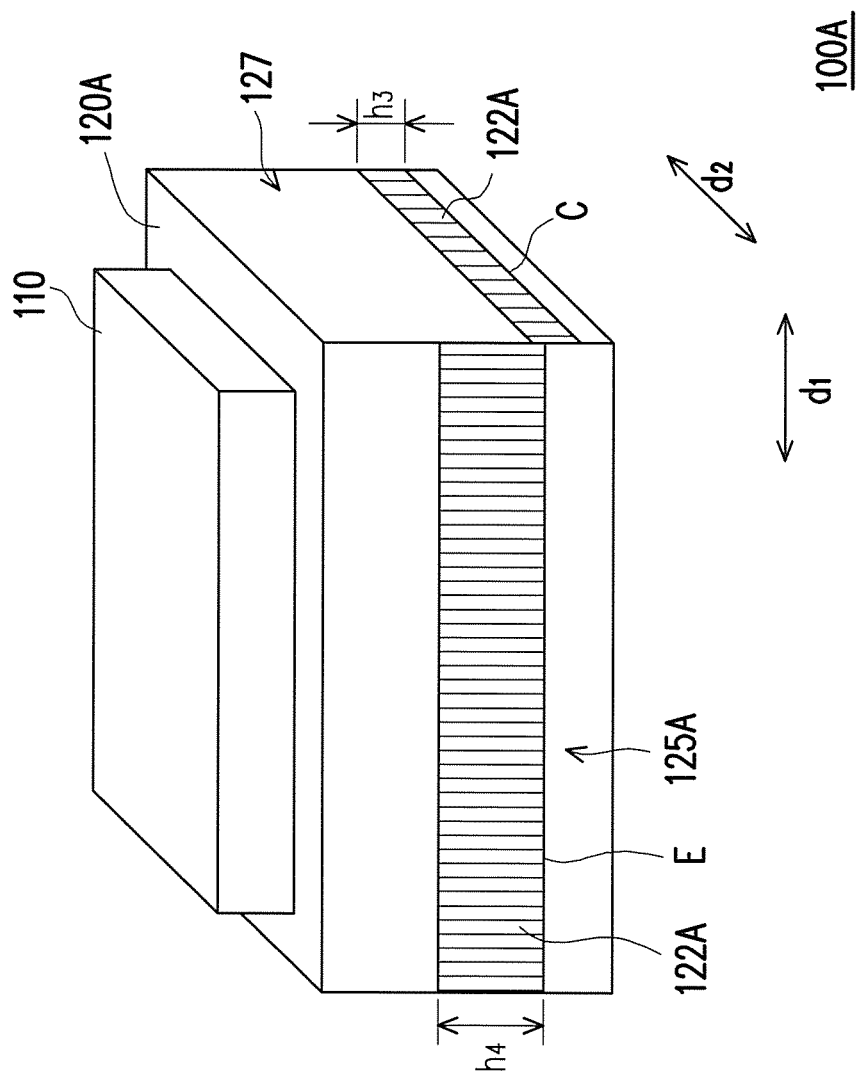
FIG. 2 is a schematic view of a light emitting device according to the second embodiment of the invention.

FIG. 2 is a schematic view of a light emitting device according to the second embodiment of the invention. Referring to FIG. 2, a light emitting device 100A and the light emitting device 100 are substantially similar, however the primary difference between the two lies in that: in the second embodiment of the invention, a first strip-shaped region E of each of first surfaces 125A has a first width $h_4$ at a direction perpendicular to the first direction $d_1$, a second strip-shaped region C of each of second surfaces 127 has a second width $h_3$ at a direction perpendicular to the second direction $d_2$, and the first width $h_4$ is greater than the second width $h_3$. In each of the first surfaces 125A, a covering area of the first strip-shaped region E on the first surface 125A is greater than a covering area of the second strip-shaped region C on each of the second surfaces 127.

In other words, the light emitting device in the embodiments of the invention is not limited to the aforementioned first embodiment, which has a configuration of a plurality of the first strip-shaped regions A and B. In the light emitting device 100A of the second embodiment, widths of the first strip-shaped regions E on the two first surfaces 125A of the light-transmitting substrate 120A are greater than a width of the second strip-shaped region C on the second surface 127. Therefore, when rough micro-structures 122A are formed on the first strip-shaped region E and the second strip-shaped region C, a covering rate of the rough micro-structures 122A on the first surface 125A may be greater than a covering rate of the rough micro-structures 122A on the second surface 127, so as to allow the light emitting device 100A to have excellent light emission efficiency.

On the other hand, the first surface 125A may be substantially formed by a first crystal plane of a crystalline material of the light-transmitting substrate 120A. The surface adapted for disposing the semiconductor light emitting unit 110 may be substantially formed by a second crystal plane of the crystalline material. Therefore, the inclined first surface 125A may provide excellent light extraction effect.

Figure 3:
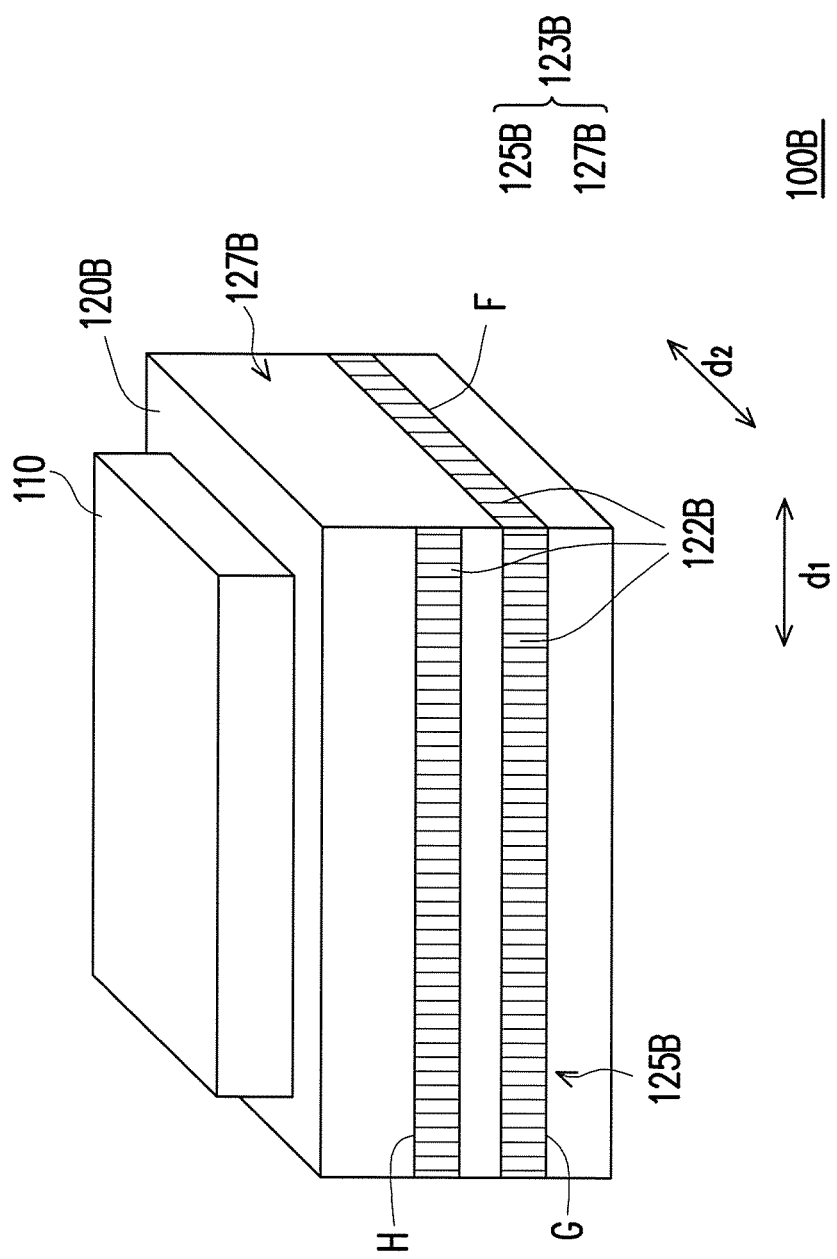
FIG. 3 is a schematic view of a light emitting device according to the third embodiment of the invention.

FIG. 3 is a schematic view of a light emitting device according to the third embodiment of the invention. Referring to FIG. 3, a light emitting device 100B and the light emitting device 100 are substantially similar, however the primary difference between the two lies in that: in the third embodiment of the invention, each of first surfaces 125B has a first strip-shaped region G and a first strip-shaped region H, and the first strip-shaped region G is connected to a second strip-shaped region F of a second surface 127B. In other words, in the present embodiment, the first strip-shaped region G and the second strip-shaped region F are formed at the same height, and each of first surfaces 125B further includes the first strip-shaped region H. Therefore, when rough micro-structures 122B are formed on the first strip-shaped regions G and H and the second strip-shaped region F, a covering rate of the rough micro-structures 122B on the first surface 125B may be greater than a covering rate of the rough micro-structures 122B on the second surface 127B, so as to enhance light emission efficiency of the light emitting device 100B.

On the other hand, the first surface 125B may be substantially formed by a first crystal plane of a crystalline material of the light-transmitting substrate 120B. The surface adapted for disposing the semiconductor light emitting unit 110 may be substantially formed by a second crystal plane of the crystalline material. Therefore, the inclined first surface 125B may provide excellent light extraction effect.

In the aforementioned embodiments of the invention, a ratio of the length of each of the long sides $S_1$ to the length of each of the short sides $S_2$ of the aforementioned light-transmitting substrates 120, 120A and 120B falls within a range of 1 to 20. In a preferred embodiment of the invention, the ratio of the length of each of the long sides to the length of each of the short sides of the light-transmitting substrate falls within a range of 1 to 10. Therefore the rough micro-structures in the aforementioned embodiments may excellently improve the light emission efficiency of the light emitting device, and the first surface may further improve the overall luminous efficiency of the light emitting device.

Figure 4A:
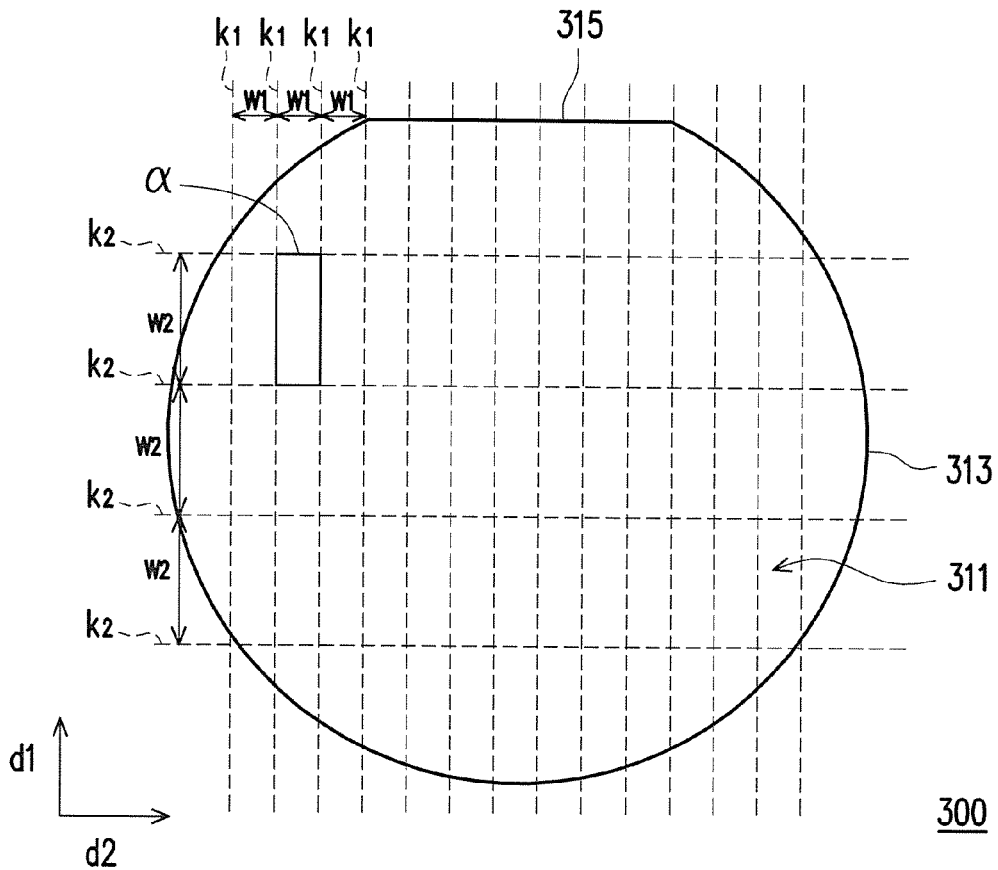
FIG. 4A is a schematic plan view of a light emitting device and a wafer according to the fourth embodiment of the invention.
Figure 4B:
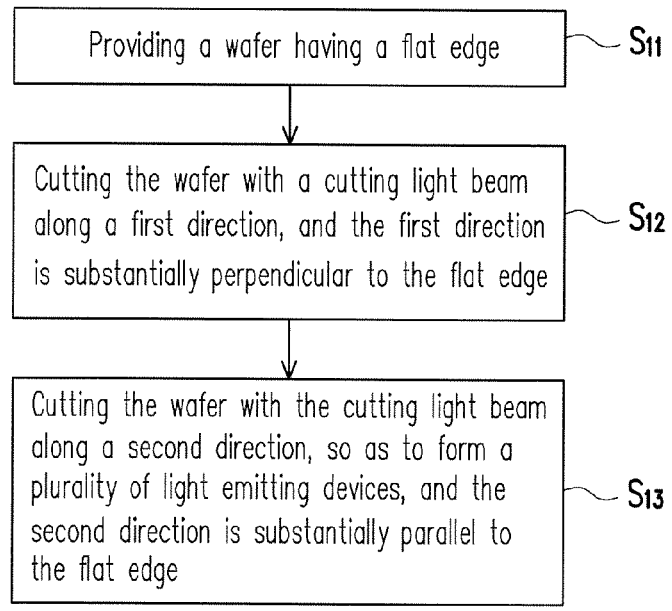
FIG. 4B is a flowchart illustrating a method for manufacturing the light emitting device according to the fourth embodiment of the invention.

Several embodiments presented below are used to describe a method for manufacturing the light emitting device in the aforementioned embodiments or other embodiments of the invention. FIG. 4A is a schematic plan view of a light emitting device and a wafer according to the fourth embodiment of the invention. FIG. 4B is a flowchart illustrating a method for manufacturing the light emitting device according to the fourth embodiment of the invention. Referring to FIGS. 4A and 4B, the method for manufacturing the light emitting device in the fourth embodiment of the invention first includes providing a wafer 300 which includes a flat edge 315 (step $S_{11}$). For example, in the present embodiment, the wafer 300 is, for example, a light-transmitting substrate 310 and a plurality of semiconductor light emitting units. The semiconductor light emitting units grow on a surface 311 of the light-emitting substrate 310, and an edge 313 of the light-transmitting substrate 310 includes the flat edge 315.

The method for manufacturing of the present embodiment includes, after the wafer 300 is provided, cutting the wafer 300 along the first direction $d_1$ with a cutting light beam, namely, cutting the wafer 300 along paths $k_1$. The first direction $d_1$ is substantially perpendicular to the flat edge 315, namely, the paths $k_1$ are perpendicular or substantially perpendicular to the flat edge 315.

Figure 5A:
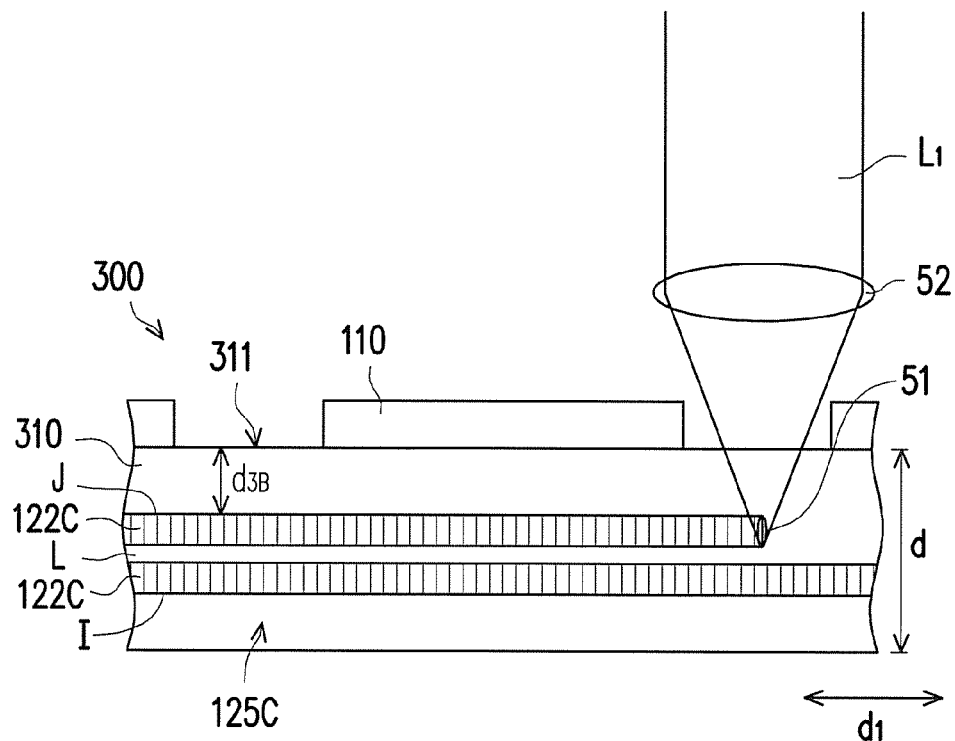
FIG. 5A is a cross-sectional view of the method for manufacturing the light emitting device by cutting a wafer along a first direction with a cutting light beam according to the fourth embodiment of the invention.

Specifically, FIG. 5A is a cross-sectional view of the method for manufacturing the light emitting device by cutting the wafer 300 along the first direction $d_1$ with the cutting light beam according to the fourth embodiment of the invention. Referring to FIG. 4B and FIG. 5A together, the wafer 300 has the light-transmitting substrate 310 and a plurality of semiconductor light emitting units 110 grew on the surface 311 of the light-transmitting substrate 310. Therefore, the method for manufacturing of the present embodiment cuts the wafer 300 along the first direction $d_1$ with the cutting light beam $L_1$ (step $S_{12}$) after the wafer 300 is provided (step $S_{11}$), thereby allowing a rough micro-structures 122C to be formed on the paths of the cutting light beam $L_1$.

Since the first direction $d_1$ is substantially perpendicular to the flat edge 315, when a second crystal plane of a crystalline material of the light-transmitting substrate 310 is parallel to the surface 311, the first direction $d_1$ is also perpendicular to a normal vector of a first crystal plane of a crystalline material of the light-transmitting substrate 310.

The cutting light beam $L_1$ in the present embodiment is, for example, a Stealth Dicing Laser, which cuts partial regions of an interior of the wafer 300 via focusing a laser beam at the interior of the wafer 300 through an optical device 52. In the present embodiment, a focal region 51 of the cutting light beam $L_1$ irradiates a first strip-shaped region I and a first strip-shaped region J along the first direction $d_1$, so as to form the rough micro-structures 122C in these regions. The first strip-shaped region I and the first strip-shaped region J have an interval region L therebetween.

Referring to FIG. 1 again together, the cutting light beam $L_1$ used in the method for manufacturing in the fourth embodiment of the invention may cut out rough micro-structures along the first direction $d_1$ similar to the rough micro-structures 122 in the first strip-shaped regions A and B of the first surface 125 of the light emitting device 100 in the first embodiment. In other words, step $S_{12}$ in the fourth embodiment of the invention forms the rough micro-structures 122C extending along the first direction $d_1$, so as to form a first surface 125C extending along the first direction $d_1$.

Figure 5B:
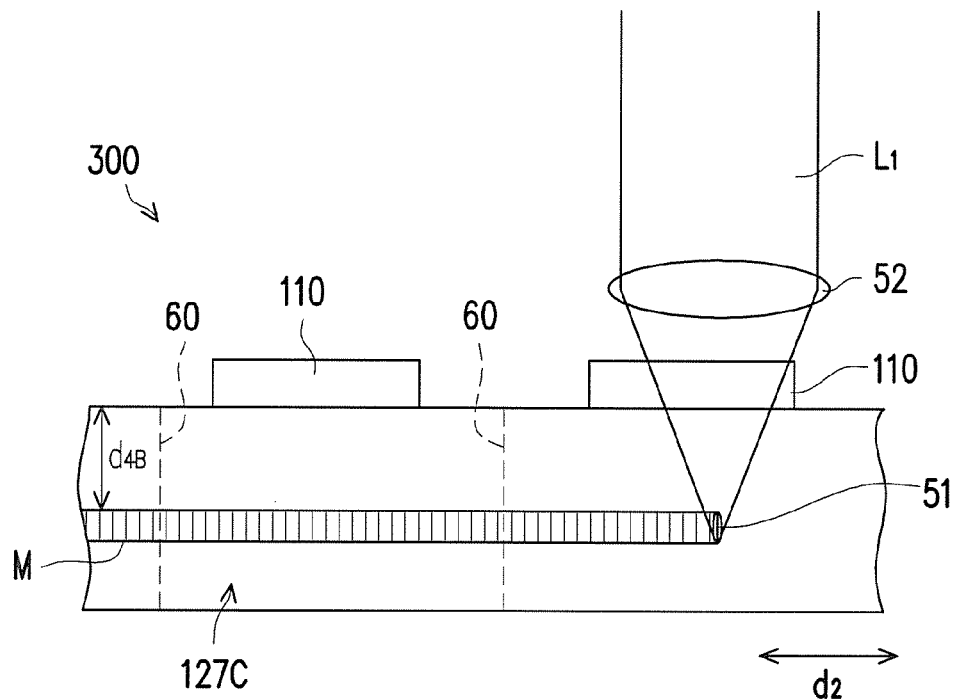
FIG. 5B is a cross-sectional view of the method for manufacturing the light emitting device by cutting the wafer along a second direction with the cutting light beam according to the fourth embodiment of the invention.

Specifically, FIG. 5B is a cross-sectional view of the method for manufacturing the light emitting device by cutting the wafer along the second direction with the cutting light beam according to the fourth embodiment of the invention. Referring to FIGS. 4 and 5B together, in the method for manufacturing of the present embodiment, after cutting the wafer 300 with the cutting light beam $L_1$ along the first direction $d_1$ (step $S_{12}$), the cutting light beam $L_1$ is then used to cut the wafer 300 along the second direction $d_2$. The second direction $d_2$ is substantially parallel to the flat edge 315, thereby allowing the rough micro-structures 122C to form on the paths of the cutting light beam $L_1$, so as to form a plurality of light emitting devices (step $S_{13}$).

In other words, by using the cutting light beam $L_1$ to cut along the first direction $d_1$ and the second direction $d_2$, the separation of for example, parts of the wafer 300 in an area a is allowed, thereby forming the light emitting device. Since the cutting light beam $L_1$ cuts along the paths $k_1$ at the first direction $d_1$, an interval $w_1$ thereof may define the length of the short sides of the subsequently formed light emitting device. Whereas the cutting light beam $L_1$ cuts along the paths $k_2$ at the second direction $d_2$, an interval $w_2$ thereof may define the length of the long sides of the subsequently formed light emitting device.

In the present embodiment, the focal region 51 of the cutting light beam $L_1$ irradiates a second strip-shaped region M along the second direction $d_2$, so as to form the rough micro-structures 122C in the region. In detail, intervals between paths 60 of the wafer 300 cut by the cutting light beam $L_1$ along the first direction $d_1$ are shorter, thus step $S_{12}$ in the present embodiment cuts the rough micro-structures on the first surface 125C of the light-transmitting substrate of the light emitting device, and step $S_{13}$ cuts the rough micro-structures on a second surface 127C of the light-transmitting substrate of the light emitting device.

Referring to FIG. 1 again together, the cutting light beam $L_1$ used in the method for manufacturing in the fourth embodiment of the invention may cut out a rough micro-structures along the second direction $d_2$ similar to the rough micro-structures 122 in the first strip-shaped region C on the second surface 127 of the light emitting device 100 in the first embodiment. In other words, step $S_{13}$ in the fourth embodiment of the invention forms the rough micro-structures 122C extending along the second direction $d_2$. In the light emitting device formed by step $S_{13}$, a covering rate of the rough micro-structures 122C on each of the first surfaces 125C is greater than or equal to a covering rate of the rough micro-structures 122C on each of the second surfaces 127C, and a covering area of the rough micro-structures 122C on each of the first surfaces 125C is greater than a covering area of the rough micro-structures 122C on each of the second surfaces 127C.

Therefore, the method for manufacturing the light emitting device in the fourth embodiment of the invention may simultaneously cut the wafer 300 and form the suitable rough micro-structures 122C on the paths. Meanwhile, through adjusting the focal region 51 of the cutting light beam $L_1$ and the irradiation path thereof, the covering rate of the rough micro-structures 122C of the light-transmitting substrate of the light emitting device formed on the first surface of the light-transmitting substrate is made greater than the covering rate on the second surface of the light-transmitting substrate. Since the method for manufacturing of the present embodiment does not require further treatment to the light emitting device after cutting and formation of the light emitting device, the production efficiency and yield of producing the light emitting devices of high light emission efficiency are greatly increased. Meanwhile, the overall production cost is also decreased.

On the other hand, in the aforementioned embodiments of the invention, a minimum depth $d_{3B}$ of the aforementioned cutting light beam $L_1$ at a position (which is the same as the position of the focal region 51) on the wafer 300 being cut along the first direction $d_1$ does not exceed ⅓ of a thickness d of the light-transmitting substrate 310 at a perpendicular direction. A minimum depth $d_{4B}$ of the cutting light beam $L_1$ at the position (which is the same as the position of the focal region 51) on the wafer 300 being cut along the second direction $d_2$ does not exceed ⅓ of the thickness d of the t-transmitting substrate 310 at the perpendicular direction, where the perpendicular direction is parallel to a normal vector of the upper surface. Therefore, the cutting light beam $L_1$ does not damage the upper surface 311 of the substrate 310 and the semiconductor light emitting unit 110 when cutting the wafer 300.

In detail, referring to FIG. 5A, in the method for manufacturing of the present embodiment, the cutting light beam $L_1$ moves along the first direction $d_1$ and cuts the wafer 300 in the first direction $d_1$ along the first strip-shaped region G, and afterwards, cuts the wafer 300 in the first direction $d_1$ along the first strip-shaped region H. Namely, a frequency of the cutting light beam $L_1$ cuts in the first direction $d_1$ is higher than a frequency of the cutting light beam $L_2$ cuts in the second direction $d_2$. Simply put, the present embodiment increases the covering rate of the rough micro-structures 122C on the first surface 125C via increasing the number of times the cutting light beam $L_1$ cuts in the first direction $d_1$, but the invention is not limited thereto.

On the other hand, the method for manufacturing the light emitting device in other embodiments of the invention may further make the cutting height of the cutting light beam $L_1$ to be the same at the first direction $d_1$ and at the second direction $d_2$. Subsequently, cutting frequencies at different heights at the first direction by the cutting light beam $L_1$ are then increased, so as to increase the covering rate of the rough micro-structures on the first surface.

Figure 6:
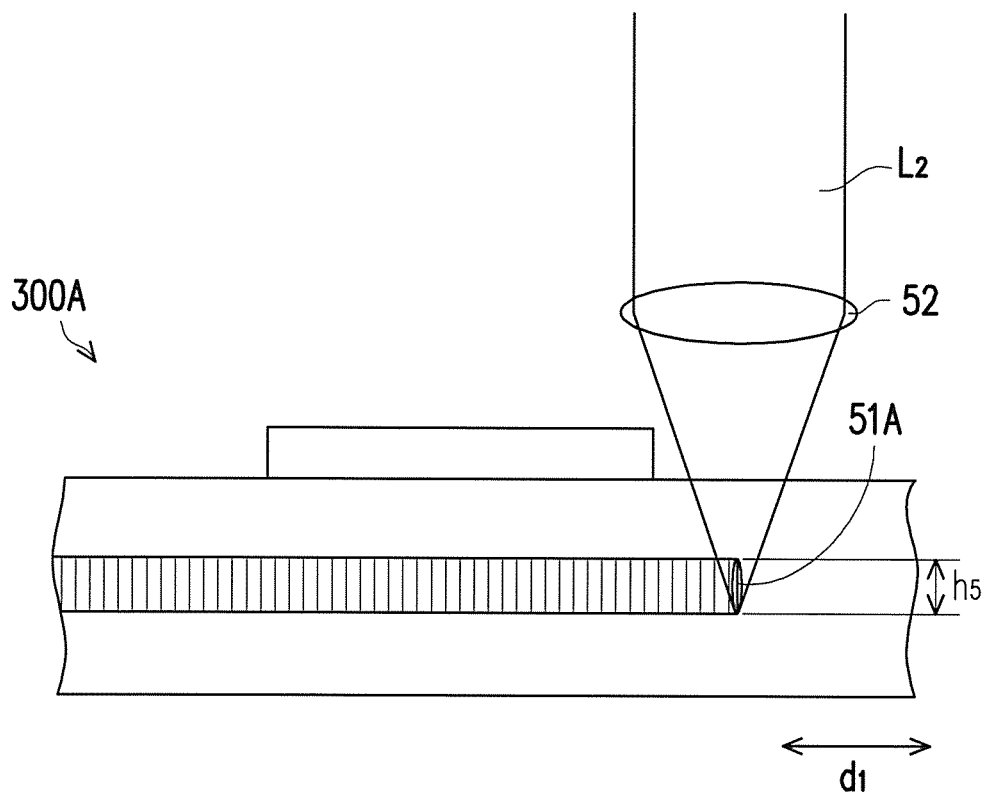
FIG. 6 is a cross-sectional view of a method for manufacturing a light emitting device by cutting a wafer along a first direction with a cutting light beam according to other embodiments of the invention.

FIG. 6 is a cross-sectional view of a method for manufacturing a light emitting device by cutting the wafer along the first direction with the cutting light beam according to the other embodiments of the invention. Referring to FIG. 6, in the sixth embodiment of the invention, a cutting light beam $L_2$ may cut a wafer 300A with a first width $h_5$, which is larger than a second width, along the first direction $d_1$, and the cutting light beam $L_2$ cuts the wafer 300A with the second width along the second direction. In other words, other embodiments of the invention may further, through adjusting the width $h_5$ of a focal region 51A of the cutting light beam $L_2$, render the light-transmitting substrate of the light emitting device manufactured through the method for manufacturing in the present embodiment to have a covering rate of a rough micro-structures on a first surface that is greater than a covering rate of a rough micro-structures on a second surface.

In summary, in the embodiments of the invention, the light-transmitting substrate of the light emitting device has the second surface, the first surface with an area greater than the second surface, and the rough micro-structure. The rough micro-structures are formed on the first surface and the second surface, therefore, light beam in the light-transmitting substrate is easier to pass through the first surface and the second surface, thereby enhancing the light emission efficiency of these surfaces. At the same time, the covering rate of the rough micro-structures on the first surface is greater than or equal to the covering rate of the rough micro-structures on the second surface. Since the side surface of the light-transmitting substrate includes these first surfaces and second surfaces, the light beam of the light emitting device may be emitted from a better emission angle. The method for manufacturing the light emitting device of the embodiments of the invention may cut the light emitting device while forming the rough micro-structures at a suitable position, and overall, the area cut by the cutting light beam at the first direction on the wafer is greater than the area cut by the cutting light beam at the second direction on the wafer. Thus, the light emitting device with excellent light emission efficiency may be formed effectively.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A light emitting device, comprising:
a semiconductor light emitting unit; and
a light-transmitting substrate, comprising:
an upper surface having two long sides and two short sides, the semiconductor light emitting unit is disposed on the upper surface; and a side surface comprising two first surfaces, two second surfaces, and rough micro-structures, each of the first surfaces is connected to one of the two long sides, each of the second surfaces is connected to one of the two short sides, the rough micro-structures are formed on the two first surfaces and the two second surfaces, wherein an area ratio of the rough micro-structures to each of the first surfaces is greater than an area ratio of the rough micro-structures to each of the second surfaces.

2. The light emitting device according to claim 1, wherein each of the first surfaces comprises at least a first strip-shaped region, each of the second surfaces comprises at least a second strip-shaped region, the first strip-shaped regions extends along a first direction, the second strip-shaped regions extends along a second direction, the first direction and the second direction are parallel to the upper surface, and the rough micro-structures are disposed on the first strip-shaped regions and the second strip-shaped regions.

3. The light emitting device according to claim 2, wherein the first strip-shaped region of each of the first surfaces has a first width at a direction perpendicular to the first direction, the second strip-shaped region of each of the second surfaces has a second width at a direction perpendicular to the second direction, the first width is greater than or equal to the second width.

4. The light emitting device according to claim 2, wherein each of the first surfaces comprises a plurality of the first strip-shaped regions, and a quantity of the first strip-shaped regions on each of the first surfaces is greater than a quantity of the second strip-shaped regions on each of the second surfaces.

5. The light emitting device according to claim 4, wherein the first strip-shaped regions on each of the first surfaces have at least an interval region therebetween, and an area ratio of the interval region on the first surface falls within a range of 0.4 to 0.8.

6. The light emitting device according to claim 2, wherein at least one of the first strip-shaped regions of each of the first surfaces is connected to one of the second strip-shaped regions of the second surface.

7. The light emitting device according to claim 1, wherein the light-transmitting substrate satisfies:

$$1 \leq \frac{R_1}{R_2} \leq 3,$$

where $R_1$ is the area ratio of the rough micro-structures to each of the first surfaces, and $R_2$ is the area ratio of the rough micro-structures to on each of the second surfaces.

8. The light emitting device according to claim 1, wherein the light-transmitting substrate satisfies:

$$\frac{d_{1B}}{d} \geq \frac{1}{3}$$

and $$\frac{d_{2B}}{d} \geq \frac{1}{3},$$

where $d_{1B}$ is a shortest distance at a perpendicular direction between the rough micro-structures on each of the first surfaces and the upper surface, wherein $d_{2B}$ is a shortest distance at the perpendicular direction between the rough micro-structures on each of the second surfaces and the upper surface, d is a thickness of the light-transmitting substrate at the perpendicular direction, and the perpendicular direction is parallel to a normal vector of the upper surface.

9. The light emitting device according to claim 1, wherein a ratio of a length of each of the long sides to a length of each of the short sides falls within a range of 1 to 20.

10. The light emitting device according to claim 1, wherein the light-transmitting substrate is formed by a crystalline material, the crystalline material comprises a first crystal plane and a second crystal plane, the long side is perpendicular to a normal vector of the first crystal plane, the upper surface is parallel to the second crystal plane, an included angle formed by the normal vector of the first crystal plane and a normal vector of the second crystal plane is greater than 90°.

11. The light emitting device according to claim 10, wherein the crystalline material further comprises a third crystal plane, a normal vector of the third crystal plane is perpendicular to the normal vector of the second crystal plane.

12. The light emitting device according to claim 10, wherein the first crystal plane is a (1012) crystal plane, and the second crystal plane is a (0001) crystal plane.

13. The light emitting device according to claim 10, wherein the crystalline material is sapphire.

14. A method for manufacturing a light emitting device, comprising:
providing a wafer, the wafer comprises a flat edge;
cutting the wafer along a first direction by a cutting light beam, the first direction is substantially perpendicular or nearly perpendicular to the flat edge; and
cutting the wafer along a second direction by the cutting light beam, so as to form a plurality of light emitting devices, the second direction is substantially parallel or nearly parallel to the flat edge, wherein each of the light emitting devices comprises:
a semiconductor light emitting unit; and
a light-transmitting substrate, comprising:
an upper surface having two long sides and two short sides, the two long sides are parallel to the first direction, the two short sides are parallel to the second direction, the semiconductor light emitting unit is disposed on the upper surface; and
a side surface comprising two first surfaces, two second surfaces, and rough micro-structures, each of the first surfaces is connected to one of the two long sides, each of the second surfaces is connected to one of the two short sides, the rough micro-structures are formed on the two first surfaces and the two second surfaces through the cutting light beam, wherein an area ratio of the rough micro-structures to each of the first surfaces is greater than an area ratio of the rough micro-structures to each of the second surfaces.

15. The method for manufacturing the light emitting device according to claim 14, wherein in each of the light emitting devices, the cutting light beam forms at least a first strip-shaped region on each of the first surfaces, the cutting light beam forms at least a second strip-shaped region on each of the second surfaces.

16. The method for manufacturing the light emitting device according to claim 15, wherein the cutting light beam cuts the wafer along the first direction with a first width, the cutting light beam cuts the wafer along the second direction with a second width, and the first width is greater than or equal to the second width.

17. The method for manufacturing the light emitting device according to claim 15, wherein a number of time the cutting light beam cuts the wafer in the first direction is higher than a number of time the cutting light beam cuts the wafer in the second direction.

18. The method for manufacturing the light emitting device according to claim 17, wherein the first strip-shaped regions on each of the first surfaces have at least an interval region therebetween, and an area ratio of the interval region to the first surface falls within a range of 0.4 to 0.8.

19. The method for manufacturing the light emitting device according to claim 15, wherein at least one of the first strip-shaped regions of each of the first surfaces is connected to one of the second strip-shaped regions of the second surface.

20. The method for manufacturing the light emitting device according to claim 14, wherein the light-transmitting substrate satisfies:

$$1 \le \frac{R_1}{R_2} \le 3,$$

where $R_1$ is the area ratio of the rough micro-structures to each of the first surfaces, and $R_2$ is the area ratio of the rough micro-structures to on each of the second surfaces.

21. The method for manufacturing the light emitting device according to claim 14, wherein a minimum depth of the cutting light beam at a position on the wafer being cut does not exceed ⅓ of a thickness of the light-transmitting substrate at a perpendicular direction, the perpendicular direction is parallel to a normal vector of the upper surface.

22. The method for manufacturing the light emitting device according to claim 14, wherein in each of the light emitting devices, a ratio of a length of the long side to a length of the short side falls within a range of 1 to 20.

23. The method for manufacturing the light emitting device according to claim 14, wherein each of the light-transmitting substrates is formed by a crystalline material, the crystalline material comprises a first crystal plane and a second crystal plane, the first direction is perpendicular to a normal vector of the first crystal plane, the second crystal plane is parallel to the upper surface, an included angle formed by the normal vector of the first crystal plane and a normal vector of the second crystal plane is greater than 90°.

24. The method for manufacturing the light emitting device according to claim 23, wherein the crystalline material further comprises a third crystal plane, a normal vector of the third crystal plane is parallel to the second direction.

25. The method for manufacturing the light emitting device according to claim 23, wherein the first crystal plane is a (1012) crystal plane, and the second crystal plane is a (0001) crystal plane.

26. The method for manufacturing the light emitting device according to claim 23, wherein the crystalline material is sapphire.

* * * * *